US009123753B2

(12) United States Patent
Porto

(10) Patent No.: US 9,123,753 B2
(45) Date of Patent: Sep. 1, 2015

(54) NANOSCALE QCA-BASED LOGIC GATES IN GRAPHENE TECHNOLOGY

(71) Applicant: STMicroelectronics S.r.l., Agrate Brianza (MB) (IT)

(72) Inventor: Domenico Porto, Catania (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/144,801

(22) Filed: Dec. 31, 2013

(65) Prior Publication Data

US 2014/0191199 A1   Jul. 10, 2014

(30) Foreign Application Priority Data

Jan. 8, 2013   (IT) .................. VI2013A0002

(51) Int. Cl.
| | |
|---|---|
| H01L 29/06 | (2006.01) |
| H01L 29/66 | (2006.01) |
| H01L 27/10 | (2006.01) |
| H01L 29/16 | (2006.01) |
| G06N 99/00 | (2010.01) |
| B82Y 10/00 | (2011.01) |
| H01L 29/82 | (2006.01) |

(52) U.S. Cl.
CPC ........... *H01L 29/66977* (2013.01); *B82Y 10/00* (2013.01); *G06N 99/002* (2013.01); *H01L 27/10* (2013.01); *H01L 29/1606* (2013.01); *H01L 29/82* (2013.01)

(58) Field of Classification Search
CPC ............................ H01L 29/7606; B82Y 10/00

USPC ................ 257/29, E21.395; 438/20
See application file for complete search history.

(56) References Cited

U.S. PATENT DOCUMENTS

| | | | |
|---|---|---|---|
| 2010/0127243 A1 | 5/2010 | Banerjee et al. | |
| 2010/0225312 A1 | 9/2010 | Nakamura et al. | |
| 2011/0042648 A1 | 2/2011 | Koo et al. | |
| 2011/0261605 A1 | 10/2011 | Kioussis et al. | |
| 2013/0328017 A1* | 12/2013 | Chen et al. | ........................ 257/29 |

FOREIGN PATENT DOCUMENTS

| | | |
|---|---|---|
| WO | WO 2008130465 A2 | 10/2008 |
| WO | WO 2009158552 A1 | 12/2009 |

OTHER PUBLICATIONS

Italian Search Report and Written Opinion dated Sep. 13, 2013 from corresponding Italian Application No. VI2013A000002.

(Continued)

*Primary Examiner* — Jami M Valentine
(74) *Attorney, Agent, or Firm* — Allen, Dyer, Doppelt, Milbrath & Gilchrist, P.A.

(57) ABSTRACT

QCA assemblies, in which basic cells are formed on the basis of graphene in order to provide a coupling field distribution in the form of an electrostatic field, a magnetic field, and the like which allows a unique association between field distribution and logic state. Moreover, the corresponding energy structure may be selected so as to allow operation of the QCA assemblies at ambient temperature. Hence, the signal processing capabilities of QCA assemblies may be obtained at significantly reduced complexity compared to conventional quantum-based QCA assemblies, which typically operate at very low temperatures.

21 Claims, 8 Drawing Sheets

(56) References Cited

OTHER PUBLICATIONS

Amlani, Islamshah, "Digital Logic Gate Using Quantum-Dot Cellular Automata", *Science American Association for the Advancement of Science*, vol. 284, No. 5412, Apr. 1999, pp. 289-291.

Crocker, Michael, "Defect Tolerance in QCA-Based PLA's", *IEEE, International Symposium on Nanoscale Architectures*, Jun. 2008, pp. 46-53.

Das, Jayita, "Low Power Magnetic Quantum Cellular Automata Realization Using Magnetic Multi-Layer Structures", *IEEE, Journal on Emerging and Selected Topics in Circuits and Systems*, vol. 1, No. 3, Sep. 2011.

Dery, Hanan, "Reconfigurable nanoelectronics using grapheme based spintronic logic gates", *Proceedings of SPIE*, vol. 8100, Jan. 2011.

Ezawa, Motohiko, "Quasi-Ferromagnet spintronics in the grapheme nanodisc-lead system", *New Journal of Physics 11*, vol. 11, Sep. 2009.

Imre, Alexandra, "Field-coupled nanomagnets for logic applications", *Proceedings of SPIE*, vol. 5837, No. 1, May 2005, pp. 162-170.

Kamimura, Takafumi, "n-Type Doping for Siingle-Walked Carbon Nanotubes by Oxygen Ion Implantation with 25 eV Ultralow-Energy Ion Beam", *Japanese Journal of Applied Physics*, vol. 44, No. 11, Nov. 2005, pp. 8237-8239.

Mircea, Stan R., "Self-Assembled Multiferroic Magnetic QCA Structures for Low Power Systems", *IEEE*, Jan. 2012, pp. 2525-2528.

Satarin, K.K., "Electron charge transfer along quantum nanosystems", *IEEE*, Jan. 2010, p. 589.

Snider, Gregory L., "Quantum-Dot Cellular Automata: Line and Majority Logic Gate", *Japanese Journal of Applied Physics*, vol. 38, No. 12, Dec. 1999, pp. 7227-7229.

Wolf, Stuart A., "The Promise of Nanomagnetics and Spintronics for Future Logic and Universal Memory", *Proceedings of the IEEE*, vol. 98, No. 12, Dec. 2010, pp. 2155-2168.

Yang, Xiaokuo, "Characteristics of signal propagation in magnetic quantum cellular automata circuits", *Micro and Nano Letters, The Institution of Engineering and Technology*, vol. 6, Iss. 6, Jun. 30, 2011, pp. 353-357.

Zeng, Minggang, "Graphene-based spin logic gates", *Applied Physics Letters, American Institute of Physics*, vol. 98, No. 9, Mar. 1, 2011, pp. 92110-1-092110-3.

\* cited by examiner

NANOSCALE QCA-BASED LOGIC GATES IN GRAPHENE TECHNOLOGY

CROSS REFERENCE TO RELATED APPLICATIONS

This application claims priority to Italian Patent Application No. VI2013A000002 filed Jan. 8, 2013, which is hereby incorporated by reference to the maximum extent allowable by law.

BACKGROUND

1. Technical Field

Generally, the present disclosure relates to the field of fabrication and usage of logic gates, for instance for computing and controlling purposes, wherein alternative methods for generating and propagating binary signals in the form of quantum cellular automata (QCA) are employed.

2. Discussion of the Related Art

Immense progress has been made in the field of semiconductor production techniques by steadily reducing the critical dimensions of circuit elements, such as transistors, in integrated circuits. For example, critical dimensions of 30 nm and less have been implemented in highly complex logic circuitry and memory devices, thereby achieving high packing density. Consequently, more and more functions may be integrated into a single semiconductor chip, thereby providing the possibility of forming entire systems on chip so that highly complex electronic circuits may be formed on the basis of a common manufacturing process. Complex integrated circuits that are produced on the basis of volume production techniques are mainly based on CMOS technology using silicon as semiconductor base material due to the many advantages of silicon in terms of availability, costs, and the like. On the other hand, intrinsic characteristics of a silicon-based semiconductor material, such as reduced charge carrier mobility, and the like, impose an ever increasing burden on well-established CMOS technology, since any advances in performance of silicon-based devices are typically dependent on a significant reduction of the critical dimensions of the basic transistor devices used. Therefore, there is an ongoing search for new materials that may efficiently replace the silicon base material for the fabrication of powerful yet cost efficient complex integrated circuits.

On the other hand, alternative approaches have been discussed for a long time, for instance with respect to increasing the overall computational power of computer devices, for instance by exploiting superior parallel operating capabilities, and the like. In this respect the concept of quantum computation has been long proposed in order to exploit quantum effects, such as non-locality, and the like, which may be used to significantly increase overall computational power. For example, the concept of QCA is a widely adapted approach to construct logic gates on the basis of a basic quantum mechanical system. For example, a QCA cell may be implemented on the basis of so-called quantum dots, which may be understood as substantially "zero"-dimensional quantum systems. A quantum dot may be seen as an "artificial atom" of reduced dimensionality, wherein an electrical charge or any other quantum mechanical property may be determined in a highly localized manner, since the quantum dot may represent a potential well for the electrical charge. For example, a quantum dot may be realized by including a small quantity of a material within the substrate, wherein the small quantity of material is appropriate to receive electrical charge, for instance in the form of a single electron or a single hole, thereby resulting in a highly localized electrically distinguishable state for the quantum dot under consideration, while on the other hand, the electrical charge may change its state by transitioning, i.e. tunnelling, from one quantum dot to a neighboring quantum dot.

For example, realization of a quantum dot may be achieved by depositing indium on a GaAs substrate, which results in a concentration of indium material within the substrate, since generally the InAs lattice structure is quite different from a gallium lattice. By using several layers of GaAs pillow-like structures can be obtained, thereby creating an appropriate structure of potentials, which results in a "distribution" of the electrical charge across several dots. Four dots realized in the same layer then constitute a QCA cell, in which two additional electrical charges, for instance in the form of electrons, can populate the quantum dots by tunnelling, thereby imparting a certain electrical charge distribution to the QCA cell. For example, for a square cell configuration the electrostatic force causes the two electrons to occupy antipodal sites within the cell, thereby enabling the distinction between two basically different polarization states.

As shown in FIG. 1A a single cell 101 may be represented by four quantum dots 104A, . . . , 104D, i.e. by four locations, each of which is able to accept an extra electrical charge 102, 103, wherein the charge may change its position on the basis of the potential distribution within a single cell and on the basis of externally acting electrostatic forces. As shown, the two extra electrical charges 102, 103 may result in two different polarization states of the basic cell 101, which may therefore represent two different logic states. For example, the logic state corresponding to the location of the electrical charges as indicated in the left-hand side of the figure may represent the cell 101 being in a logic "0", while the state represented by cell 101 at the right hand side may be identified as a logic "1". These states can readily be identified as those states having minimum energy with respect to the resulting electrostatic forces acting between the two additional electrical charges 102, 103.

As is evident, by providing a plurality of basic cells 101, which interact with each other by electrostatic forces, a quantum dot QCA assembly may be obtained. It should be appreciated that the basic cell configuration is selected such that quantum mechanical tunnelling of the electrical charges 102, 103 does not occur between neighboring cells and the interaction between neighboring cells is conveyed by electrostatic forces only. For example, a typical lateral dimension 101D may be in the order of magnitude of 10 nm, while a distance between neighboring basic cells 101 may be in the order of magnitude of several tens of nm.

FIG. 1B schematically illustrates a plurality of basic cells 101A, . . . , 101E, which may be considered as a QCA assembly 100, wherein the logic states of one of the basic cells may be determined by the logic state of the neighboring cells. For convenience, only the quantum dots are illustrated, which actually comprise the localized extra charges 102, 103. As shown, the basic cell 101A is in a polarization state, which corresponds to a logical "0". On the other hand, the basic cells 101B, . . . , 101E have the localized charges 102, 103 so as to correspond to a logical "1". As discussed above, the resulting polarization state of any of the basic cells may be considered as being determined by the effect of the electrostatic forces exerted by the surrounding cells. If, for instance, one or more of the basic cells of the assembly 100 may be considered as cells, whose state may be forced into a desired polarization state based on an appropriate mechanism, these cells may be considered as "input" of the assembly 100. It may, for instance, be assumed that the cells 101A, 101D and 101C are forced into the respective polarization states 0, 1, 1 as shown in FIG. 1B. In this case the central cell 101E therefore transitions into the logic state "1" due to the "majority" effect of the resulting combined electrostatic force exerted by the surrounding "input" cells 101A, . . . , 101C on the central cell 101E. Hence, the central cell 101E may be considered as a central "device" representing the result of the logic states input in the assembly 100 by the "input" cells 101A, 101D, 101C. Furthermore, if the cell 101B also represents the basic cell whose polarization state may freely adjust with respect to the surrounding electrostatic forces, its polarization state will be a copy of the state of the central cell 101E, since this cell is the nearest neighbor of the cell 101B. Hence, the cell 101B may represent an "output" of the assembly 100 and may be coupled to another assembly or to any other components so as to provide an appropriate voltage level for about electronic devices.

Based on this "majority" effect appropriate structures for signal processing, i.e. signal propagation and signal manipulation, may be constructed, such as logic gates, thereby realizing computational resources and signal processing capabilities at extremely low power levels.

With reference to FIGS. 1C to 1H some illustrative examples for signal processing on the basis of respective QCA assemblies will now be described, wherein it is assumed that a signal is provided in the form of a bit sequence, i.e., the signal is presented by a sequence of binary logic states.

FIG. 1C schematically illustrates the QCA assembly 100 in the form of a linear configuration including the basic cells 101A, . . . , 101F. As is evident when inducing a logic state "1" at any of the basic cells, this injected logic state will propagate along the linear configuration due to the above described majority effect. For example, when causing the basic cell 101A to take on the logic state "1", this state will travel through the entire linear configuration at high speed and low power consumption. In this manner linear conductors for conveying a signal in the form of a bit sequence may be established. FIG. 1D schematically illustrates a non-linear configuration, wherein the spatial direction of signal transport may be changed, for instance under a right angle. However, any other spatial configuration may be established. It should be appreciated that, in comparison to a conventional conductive line, problems, such as current crowding, and the like, may be avoided, even if extremely sharp corners have to be implemented, thereby providing for superior design flexibility.

FIG. 1E schematically illustrates the QCA assembly 100 in the form of an inverter, in which the majority effect results in identical polarization states of the basic cells 101A, . . . , 101E, while on the other hand the principle of minimized energy requires the basic cell 101F, and thus any further basic cells immediately adjacent thereto, to take on the complementary polarization stage, thereby achieving a bit inversion.

FIG. 1F schematically illustrates the QCA assembly 100, in which a logic state, for instance input at the basic cell 101A, may be transferred and then output by two different "output" cells 101C and 101D, thereby obtaining a "fan out" function.

FIG. 1G schematically illustrates the QCA assembly 100 in the form of an AND gate, which is accomplished by providing a basic cell 101A having a fixed polarization state or charge distribution, which represents a logic state "0". On the other hand the basic cells 101B and 101D may represent input cells, in which a desired logic state or bit value is induced. As discussed above, due to the majority effect the central cell 101C and thus the output cell 101E will take on a logic state "1" only when the logic state of both the basic cells 101B and the basic cell 101D is "1". For any other case the majority effect results in the central cell 101C taking on the logic state "0".

Similarly FIG. 1H illustrates the QCA assembly 100 in the form of an OR gate, in which the basic cell 101A is in a fixed logic state "1", while the basic cells 101B and 101D function as input cells, as discussed above. As is evident, due to the majority effect an OR association of the input cells is obtained at the output cell 101E.

The implementation of signal processing capabilities by using QCA assemblies is a very promising approach for overcoming the significant difficulties that are associated with complex signal processing devices based on conventional CMOS technology, in particular, as features, such as parallel processing, and the like, may readily be implemented on the basis of QCA assemblies. One of the most promising technologies for implementing quantum dots and thus QCA assemblies, is the generation of Bose-Einstein condensates, which is frequently applied in order to overcome the significant difficulties in traditional QCA assemblies based on the deposition of indium on a GaAs substrate, as discussed above. However, the generation of a Bose-Einstein condensate requires extremely low temperatures in order to obtain the very unique properties of condensed atoms, each of which has the same quantum states. Therefore, tunnelling and quantum effects may occur at a macroscopic scale, thereby providing advantages with respect to define and detect a corresponding state of the condensate. However, as already mentioned above, the very low operating temperature of approximately 1K makes this approach less than desirable for practical applications.

It is therefore an object of the present disclosure to apply cellular automata assemblies for signal processing while avoiding or at least reducing the effects of one or more of the problems identified above.

SUMMARY

The present disclosure relies on the concept that the principles of QCA may be applied in the "classical" level so as to circumvent the significant problems, which are typically associated with the handling and preparing of appropriate quantum systems, such as Bose-Einstein condensates. To this end, it has been recognized that materials may be used, which have very promising features with respect to circuit applications in a nano scale regime, thereby providing the possibility of implementing the desired cellular automata functionality, however, without requiring quantum mechanical effects, such as tunnelling, and the like. For example, in the recent years graphene has become a material that has attracted much attention due to its unique properties, such as high charge carrier mobility, flexibility, transparency, and the like. Graphene is a carbon material that can be understood as a thin layer of a graphite material with a thickness of, for instance 0.3 nm, wherein the carbon atoms are arranged in a honeycomb structure. Although the electronic structure of graphene significantly differs from the electronic structure of typical semiconductors, such as silicon, by appropriate doping it may take on nearly any desired electrical properties in order to form electronic basic blocks, such as transistors.

In the present disclosure, however, graphene is considered as an appropriate molecular candidate for forming basic cells of a cellular automata assembly, which will also be referred to herein as QCA assembly, even though quantum mechanical effects are less dominant and important when implementing QCA functionality on the basis of graphene. That is, it has been recognized that in contrast to metallic or semiconductor QCA assemblies the dimensions of automata on a molecular scale, when implemented on the basis of graphene, allow for operation at ambient temperature due to the greater electrostatic energy associated with molecules or ions that may be connected to the basic graphene structure. Similarly, the superior properties of graphene allow the fabrication and operation of relatively small areas, such as square-like layers, ribbons, and the like, so as to provide for superior flexibility in producing appropriate basic cells of QCA assemblies.

Furthermore, the structure flexibility and the potential for providing a physical band gap, in addition to further mechanisms, such as doping, intentional incorporation of structural defects, and the like, enable the generation of a bi-stable charge system or magnetic system in order to implement the desired basic logic states. For example, by appropriately reshaping the graphene layer or a corresponding layer stack appropriate localized energy minima may be achieved, in which respective extra charges may be positioned in order to represent an appropriate logic state. On the other hand, the respective extra charges may change position from one minimum to another under the influence of an electric field distribution generated by a neighboring basic cell.

In other cases, the graphene layer may represent the surface of a nanotube, on which appropriate charges in the form of ions or electronegative molecules may be fixed so as to allow a desired interaction with neighboring nanotubes, thereby also implementing a QCA assembly. Similarly, based on the superior electrical and mechanical properties of graphene layers a basic cell may be formed by using magnetic fields on nanoscale, thereby also providing an efficient interaction mechanism so as to obtain the majority effect required for signal processing in a QCA assembly.

In particular, according to one embodiment, there is provided a cellular automata assembly for processing a signal. The assembly comprises a first basic cell comprising a first graphene layer used to induce a first coupling field distribution. The assembly further comprises a second basic cell positioned adjacent to the first basic cell and comprising a second graphene layer used to induce a second coupling field distribution, wherein the first and second basic cells interact with each other by the first and second coupling field distributions so as to determine a logic state of the signal.

As discussed above, the inventive cellular automata assembly comprises the first basic cell, in which a graphene layer is appropriately configured to provide the capability of interacting with a neighboring basic cell. To this end, an appropriate coupling field distribution, such as an electrostatic field, and magnetic field, or an electromagnetic field, is established with an appropriate field distribution so as to enable the interaction with the neighboring basic cell, thereby obtaining the majority effect, in which signal processing is achieved by propagating and/or manipulating logic states of a signal.

In this respect, it is to be noted that throughout this application a binary system of logic states will be described in accordance with well-established logic devices formed on the basis of semiconductor technology. It should be appreciated, however, that the principles disclosed herein may also be applied to signal processing, in which any number of distinguishable states of a basic cell may be used in order to obtain signal processing capabilities. For example, when referring to an electrostatic field distribution in a basic cell, the respective field distribution may allow the distinction of three or more separate states. At the same time this more complex field distribution may also be determined by the field distribution in the vicinity of the basic cell under consideration, thereby also providing for a majority effect.

As is also discussed above, in embodiments the basic cells of the cellular automata assembly are appropriate configured so as to preserve the interacting field distribution at elevated temperatures, such as ambient temperature, thereby allowing reliable operation of the assembly at typical operating conditions, under which conventional electronic devices have to be operated. This is achieved by selecting appropriate interaction mechanisms, such as the provision of electronegative molecules, ions, magnetic fields, and the like, which are still sufficiently stable at elevated temperatures, yet allowing a well-defined change in orientation due to the interaction with a neighboring basic cell. In this respect the first and second coupling field distributions may be considered as representing "classical" quantities, such as an electrostatic field distribution, compared to pure quantum mechanical systems, in which typically extremely low temperatures are required, since a respective energy for inducing a change of state may be quite below thermal energy levels associated with ambient temperature conditions.

In one illustrative embodiment the first graphene layer forms a first carbon nanotube and the second graphene layer forms a second carbon nanotube. That is, in this configuration the basic cells of the assembly are provided as carbon nanotubes, which may appropriately be configured so as to allow the coupling of adjacent tubes on the basis of the coupling field distributions in order to obtain the desired majority effect.

To this end, in one illustrative embodiment the assembly further comprises a first electrical charge adhering to the first graphene layer and a second electrical charge adhering to the second graphene layer. That is, by means of the first and second electrical charges the coupling of adjacent basic cells may be accomplished, wherein the first electrical charge and the second electrical charge are selected such that at least two different distinct states of respective neighboring basic cells are obtained. For example, when two neighboring nanotubes interact with each other a rotational motion may be induced so as to achieve a relative position state with minimal potential energy depending on the distribution of the first electrical charge on the first nanotube and the second electrical charge on the second nanotube. That is, the rotational position of one nanotube may induce a corresponding rotation of the neighboring nanotube in such a manner that finally the relative rotational position of minimum energy of the two neighboring nanotubes is taken.

For example, in one illustrative embodiment each of the first and second electrical charges is carried by hydrogen ions and/or oxygen ions. It is well known that hydrogen ions and oxygen ions may efficiently be connected to a carbon layer of hexagonal structure, thereby enabling the formation of a string of charges on the outer surface of the carbon nanotube.

In one embodiment each of the first and second electrical charges is carried by a string of hydrogen ions and a string of oxygen ions. That is, a string of hydrogen ions and a string of oxygen ions may be provided alternately, thereby obtaining a symmetric efficient coupling field distribution, which may be efficiently coupled to a neighboring basic cell so as to induce a corresponding rotation into a relative position of minimum energy. Due to the provision of a string of negative charge and positive charge in an alternating manner two different logic states, i.e. rotational positions of minimum energy, are provided, which can be detected in a reliable manner.

In a further illustrative embodiment each of the first and second graphene layers comprises non-planar layer portions so as to receive therein an electrical charge. As already discussed above, the advantageous properties of graphene allow a modification of the layer structure such that localized layer portions can be provided, in which sources of the coupling field distribution may be positioned, for instance in the form of electrical charges, wherein, however, the localized state of the respective electrical charges is associated with an energy that provides stability at ambient temperature, yet enables a change of position when coupling to the force field of a neighboring basic cell. The deviation from the planar layer configuration may provide an appropriate technique for implementing an area of a local energy minimum so as to "confine" a desired electrical charge. For example, substantially hemispherical cavities may be formed as the non-planar portions, which may provide per se or in combination with additional measures for a semi-stable positioning of electrical charges. Respective modifications on the layer structure of graphene may, for instance, be accomplished by intentionally incorporating structural imperfections, doping molecules, and the like. In this manner a desired coupling field distribution may be obtained so as to allow the interaction with neighboring basic cells and the identification of distinct states of the basic cells. For example, in illustrative embodiments each of the first and second graphene layers comprises four non-planar layer portions, two of which contain a movable electrical charge. In this manner, a square-like cell configuration may be achieved, in which two different basic states allow signal processing using the QCA configurations, as discussed above in the context of the prior art.

In a further illustrative embodiment the first basic cell comprises a first planar graphene base layer and the second basic cell comprises a second planar graphene base layer. That is, in this embodiment each basic cell comprises an additional graphene layer, which, in combination with the graphene layers having the non-planar portions, may result in a superior energy structure for receiving the movable electrical charges. For example, the additional graphene base layer and the corresponding non-planar graphene layer may form a physical band gap, which in turn results in appropriate energetic conditions for receiving an electronegative molecule or an ion. If desired, the non-planar layer portion and/or the corresponding portion of the base layer may have incorporated therein a dopant species so as to further modify the overall energy conditions for receiving the electrical charge. That is, in one illustrative embodiment the first graphene layer and the first planar graphene base layer in the first basic cell and the second graphene layer and the second planar graphene base layer in the second basic cell are arranged so as to form local energy minimums for the electrical charge in the non-planar layer portions.

Preferably, the electrical charge is carried by an electronegative molecule or an ion. In this manner, as discussed above, the involved energy levels for confining or moving the electrical charge or in a range that allows operation at ambient temperature.

In a further illustrative embodiment the first and second graphene layers are provided as one or more graphene ribbons. As discussed above, the superior properties of graphene allow specifically designed ribbons of appropriate dimensions to be efficiently fabricated, wherein these graphene ribbons may be used for establishing the desired coupling field distribution having distinctive states and enabling their coupling with neighboring basic cells.

In one embodiment at least a portion of the one or more graphene ribbons is wound so as to induce a magnetic field when inducing a current flow through the one or more graphene ribbons. As already discussed above graphene may inherently have a moderately high conductivity, thereby allowing a current flow to be established on the basis of relatively low supply voltages, which in turn enables the generation of a magnetic field at nanoscale in order to implement the desired coupling field distribution. The current flow may be initiated by direct contact to a voltage source or current source, while in other cases a non-contact mechanism may be used in the vicinity of the basic cells in order to induce a voltage and thus current flow, which in turn may give rise to the magnetic field.

In one illustrative embodiment the at least a portion of the one or more graphene ribbons is wound around a ferromagnetic object, which itself may be provided in the form of a nanotube, and the like. In this manner, the current induced magnetic field may be amplified, thereby obtaining a desired energy level that is required for changing the spatial orientation of the magnetic field induced by the current flow through the one or more graphene ribbons. In this manner, a reliable operation at ambient temperature is ensured.

In one advantageous embodiment the first basic cell comprises a first and a second magnetic pole pair and the second basic cell comprises a first and a second magnetic pole pair. The provision of at least two magnetic pole pairs for each basic cell results in an efficient response to an external magnetic field generated by a neighboring basic cell, irrespective of the spatial orientation of the basic cell under consideration. For example, each magnetic pole pair in a respective basic cell may be obtained by the current flow through a corresponding graphene ribbon, possibly in combination with an associated ferromagnetic component, such as a nanotube, as discussed above. By using oppositely arranged pole pairs a relatively stable configuration may be obtained, which may thus respond as a whole to an external magnetic field. In some cases the relative position of the two magnetic pole pairs may be fixed by any appropriate means in order to further enhance the mechanical integrity of a single basic cell. In this manner, neighboring basic cells may interact with each other by taking on an appropriate rotational position with respect to each other in order to minimize the potential magnetic energy. In this manner, neighboring cells may align to each other by attraction of opposite poles.

In a further illustrative embodiment the cellular automata assembly further comprises at least one further basic cell so as to interact with at least one of the first and second basic cells. As already discussed above, by providing a plurality of basic cells efficient signal propagation paths, logic gates, and the like may be implemented in order to address the required signal processing capabilities. These signal processing capabilities may be established on the basis of the graphene containing basic cells including the respective coupling field distributions, which allow a distinction of "logic" states of the basic cells and the adjustment of the logic state of neighboring basic cells due to the majority effect, as explained above. The mechanisms for establishing the coupling field distribution may be selected on the basis of the graphene material such that sufficient stability of the field distribution is achieved at ambient temperature, while still allowing a change of state due to the influence of the coupling field distribution of a neighboring basic cell.

According to a further embodiment, there is provided an electronic device for processing a signal. The electronic device comprises a cellular automata assembly as already discussed above or as will be described in the following detailed description. Furthermore, the electronic device comprises an input stage configured to receive the signal and to interact with at least one basic cell of the cellular automata assembly so as to adjust a logic state of the at least one basic cell in correspondence with the signal. Moreover, the electronic device further comprises an output stage configured to interact with at least one other basic cell of the cellular automata assembly so as to provide an output signal corresponding to a logic state of the at least one other basic cell.

Hence, the inventive electronic device advantageously exploits the signal processing capabilities associated with the above-described cellular automata assembly and at the same time enables communication with any components or devices by means of the input stage and the output stage. For example, the electronic device may interface with conventional electronic devices, for instance formed on the basis of conventional semiconductor techniques, and the like, in order to receive a signal therefrom and/or output a signal processed by the assembly. In this manner, the superior signal processing capabilities of a QCA assembly, for instance in terms of parallel processing, power consumption, speed, and the like, may efficiently be combined with the capabilities of conventional electronic, electromechanical, optoelectronic devices. Due to the graphene based configuration of the cellular automata assembly the entire system may be operated under identical environmental conditions, without requiring the establishing of extremely low temperatures, as is the case for conventional QCA assemblies.

In one illustrative embodiment the output stage comprises a charge sensitive component configured to determine a charge distribution in at least a portion of the at least one other basic cell. By providing a charge sensitive component the coupling field distribution and thus the logic state of the at least one other basic cell, which may thus represent an output of the cellular automata assembly, may reliably be detected. Hence, the charge sensitive component may provide any appropriate output signal, such as an optical signal, an electrical signal, a magnetic signal, an acoustic signal and the like, in order to indicate the logic state of the output cell. The output signal may then be used by any other appropriate device so as to implement a further signal processing function, for instance on the basis of conventional electronic devices.

In a further illustrative embodiment the output stage comprises a magnetic field sensitive probe configured to determine a magnetic field distribution in at least a portion of the at least one other basic cell. As previously discussed, at least two different logic states may also be implemented on the basis of a magnetic field distribution within a basic cell, while at the same time enabling an appropriate interaction with nearest neighbors so as to provide signal processing capabilities. Consequently, by equipping the output stage with the magnetic field probe the different logic states represented by the specific magnetic field distribution may efficiently be detected and converted into any other appropriate signal for indicating the logic state of the corresponding basic cell to other components.

In one illustrative embodiment the output stage comprises a position detecting component configured to detect a charge carrying molecule or ion. With this configuration the coupling field distribution, which may substantially represent an electrostatic field generated by a charge carrying molecule or ion, may vary in a position dependent manner tracked by the position dependent component, thereby reliably detecting the respective logic state of the basic cell under consideration. For this purpose, many appropriate interaction mechanisms are available so as to detect objects of molecular or atomic size, such as channel electron multipliers, atomic force probes, detectors using short wavelength radiation, and the like.

In a further illustrative embodiment the input stage is configured to provide at least one of an electric and magnetic field distribution so as to preserve the logic state of the at least one basic cell for a predetermined input time interval. The input stage is appropriately configured to induce and preserve for a sufficient time period a desired field distribution in the input cell, thereby allowing the input cell to interact with one or more nearest neighbors so as to effect a corresponding response to the induced input state. In this manner, logic states and thus any signal represented by the logic states may be input into the cellular automata assembly for further signal propagation and/or signal processing. To this end, also any appropriate interaction mechanism may be applied, as for instance also discussed with respect to the output stage.

BRIEF DESCRIPTION OF THE DRAWINGS

Further embodiments are described in the appended claims and will also be described with reference to the following detailed description, which is to be understood in the context of the attached drawings, in which:

DETAILED DESCRIPTION

Figure 2A:
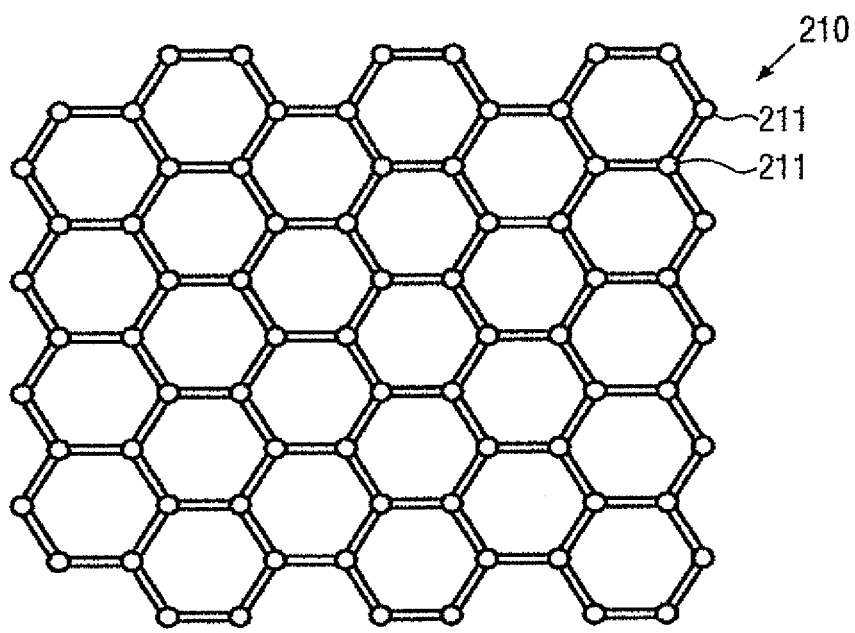

FIG. 2A schematically illustrates a layer 210 of carbon atoms 211, which are arranged in a honeycomb structure or hexagonal structure, which is typically referred to in the literature as graphene. As already discussed above, the layer 210 has a thickness of 0.3 nm with superior flexibility, transparency and charge carrier mobility. For these reasons, graphene is considered a very promising candidate for future integration technologies. The graphene layer 210 may be used as a basic ingredient for constructing appropriate basic cells of a QCA assembly, which may be operated at ambient temperature by forming an appropriate field distribution within and in the vicinity of a basic cell so as to enable, on the one hand, to obtain on the basic of the field distribution at least two distinct states, which are also referred to herein as logic states, while on the other hand, the field distribution allows a sufficient interaction with nearest neighbors in order to reconfigure the field distribution or the sources of the corresponding field distributions. In this manner signal processing capabilities, i.e. signal propagation and signal manipulation, may be achieved, as for instance already discussed in the introductory part of this application, wherein the involved energy levels for changing the field distribution, for instance by reconfiguring electrical charges, magnetic pole pairs, and the like, may be sufficiently high so as to be not significantly disturbed by the thermal energies typically associated with environmental conditions at ambient temperature.

It should be appreciated that the capability of the basic cell to interact with its nearest neighbors on the basis of any appropriate field, such as an electrostatic field, a magnetic field, or generally an electromagnetic field, is also described herein by the term "coupling field distribution". It should be understood, however, that this term represents both a field distribution for identifying at least two distinct logic states within each basic cell and also the capability of interacting with nearest neighbors so as to readjust therein the respective field distribution, also referred to herein as "majority effect".

Figure 2B:
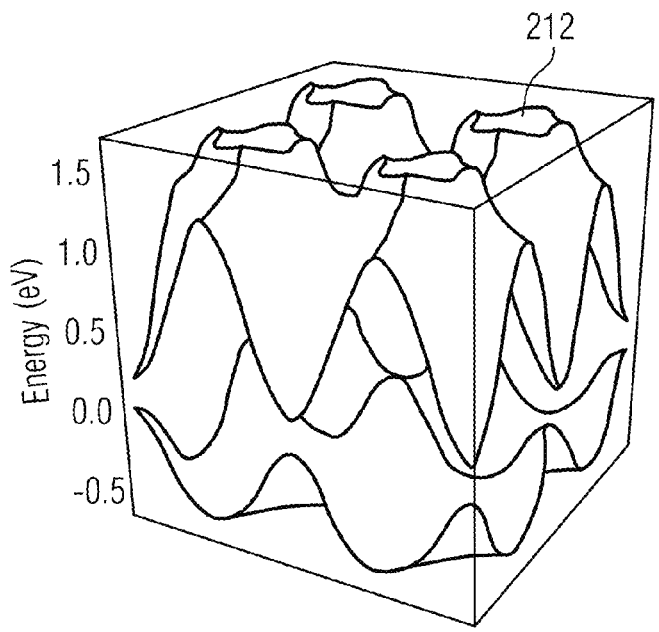

FIG. 2B schematically illustrates the energy structure of a configuration formed on the basis of graphene, as will be discussed later on in more detail, in which appropriately configured energy minima 212 are present, which allow to receive and temporarily confine an appropriate electrical charge at ambient temperature while still enabling the movement of electrical charges from one energy minimum to another when being affected by the field of one or more nearest neighbors. In this manner, appropriate square-like basic cells may be constructed, as for instance discussed above in the introductory part, wherein the spatial configuration of, for instance, two extra charges, may be used to define two different logic states, which may be reconfigured by electrostatic interaction with a neighboring basic cell, wherein the electrostatic energy is sufficiently high so as to ensure stability of the charge configurations at ambient temperature. Respective cell configurations will be described later on with reference to FIG. 4.

Figure 3A:
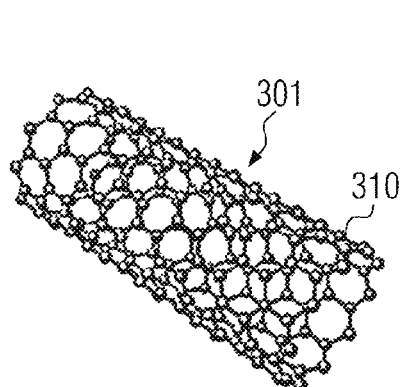

FIG. 3A schematically illustrates a perspective view of a basic cell 301, which may be used to construct a QCA assembly on the basis of graphene. To this end, the basic cell 301 may comprise a graphene layer 310, which may be provided in the form of an appropriately dimensioned layer portion, which is formed into a cylinder or nanotube. It should be appreciated that the formation of carbon nanotubes is well established in the art. The nanotube may be considered as a graphene layer formed into a tube like structure. In order to implement two or more distinct logic states in the basic cell 301 additional modifications may be incorporated in the layer 310, for instance by adhering appropriate sources of a physical field, such as an electrostatic field, and the like. To this end, appropriate "charge carriers" may be added that may impart a desired distinct field distribution to the basic cell 301, wherein the charge carriers may not necessarily need to add extra net charge to the cell. In other cases, ions may be attached to the layer 310 at appropriate positions in order to obtain a desired coupling field distribution that enables the identification of distinct states and the interaction with neighboring basic cells. In other cases, structural modifications may be incorporated, for instance by intentionally damaging the structure of the layer 310, possibly in combination with the incorporation of appropriate "dopant species", which may be introduced into the modified structure so as to obtain a position dependent field distribution. For example, respective dopant species may sufficiently affect the local electrostatic field in a unique manner so as to allow a mapping of spatial orientation to logic states.

Figure 3B:
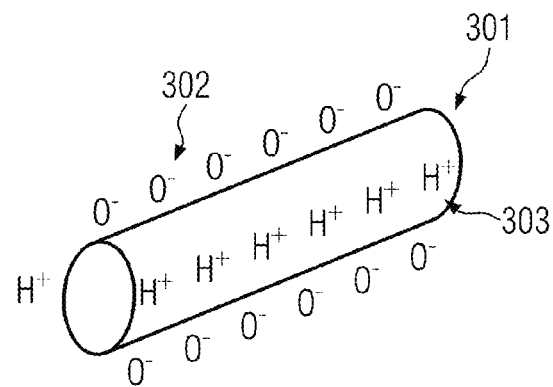

FIG. 3B schematically shows an illustrative embodiment, in which the basic cell 301 comprises extra charges 302 and 303, which may be provided in the form of hydrogen ions and oxygen ions. As illustrated, the respective ions may be provided in the form of strings attached to the basic structure of the graphene layer 310 (FIG. 3A). In the embodiment shown the strings of hydrogen ions and oxygen ions are attached in a rotation-symmetric manner, thereby allowing a unique mapping between rotary position and logic states of the basic cell 301.

Figure 3C:
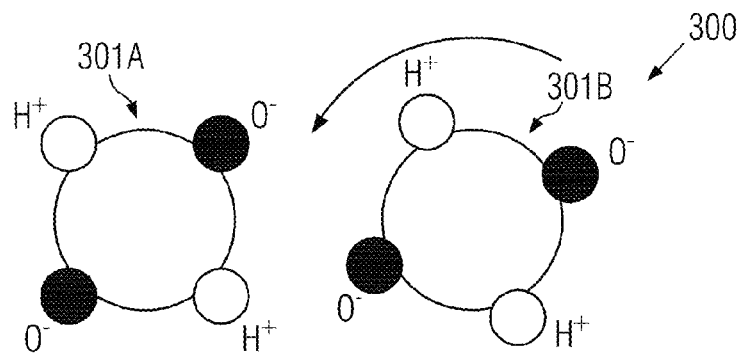

FIG. 3C schematically illustrates a cellular automata assembly 300 comprising a first basic cell 301A and a second basic cell 301B, which comprise respective coupling field distributions, whose sources represent the corresponding strings of charges 302, 303 (FIG. 3B). As shown, the corresponding electrostatic fields, i.e. the coupling field distributions, may interact with each other, thereby rotating the basic cell 301B into a rotary position that corresponds to an energy minimum with respect to the coupling forces between the basic cells 301A and 301B. In this manner, neighboring basic cells follow the neighborhood orientation and thus provide the capability of signal propagation and logic gate functions, as already discussed above. It should be appreciated that also the corresponding majority effect may be obtained by providing three or more basic cells in the assembly 300, so that the corresponding relative rotary positions may adjust in accordance with the majority effect.

Figure 3D:
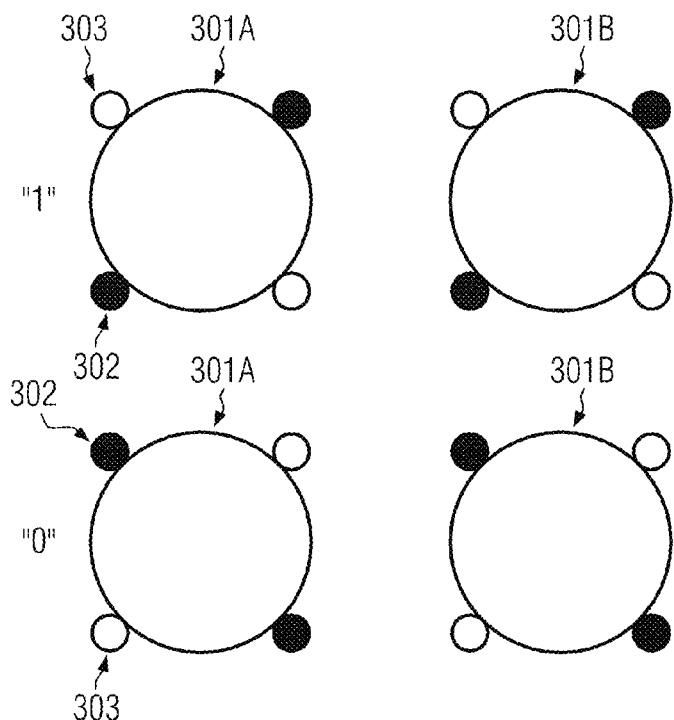

FIG. 3D schematically illustrates the assembly 300 according to two different situations, for instance when a logic "1" is propagating through the assembly 300 (upper portion of FIG. 3D) and when a logic "0" is propagating through the assembly 300 (lower portion of FIG. 3D). That is, in the upper portion the basic cells 301A and 301B have a relative rotary position to each other that corresponds to an energy minimum, wherein, for instance, the position of the charge strings 302, 303 may be detected so as to reliably define a corresponding logic state, for instance a state "1".

Similarly, the relative rotary positions of the basic cells 301A and 301B in the lower portion of FIG. 3D corresponds to an energy minimum, wherein, however, the positions of the corresponding charge strings is reversed, for instance with respect to an "up/down" reference system, thereby allowing the distinction between two different logic states.

Figure 1A:
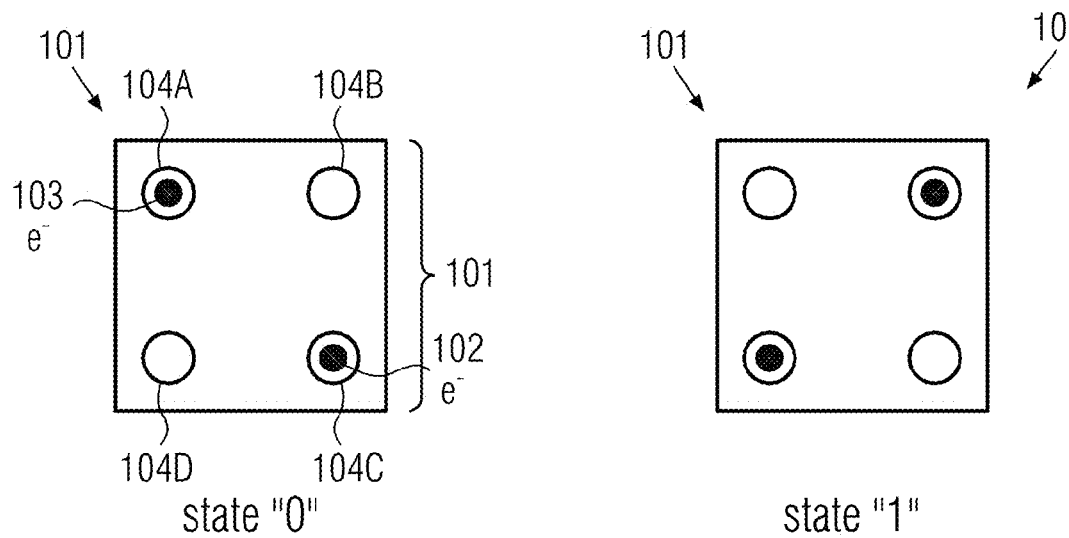
FIG. 1A schematically illustrates conventional square-like basic cells that may be used in a cellular automata assembly, FIG. 1B schematically illustrates an assembly of basic cells in order to demonstrate the "majority" effect caused by the coupling field distribution, for instance the electrostatic field caused by two distinct spatial configurations of electrical charges, FIGS. 1C to 1H schematically illustrate various configurations of conventionally designed basic cells in order to implement various signal processing functions, FIG. 2A schematically illustrates a layer of carbon atoms arranged in a hexagonal structure, which is typically referred to as graphene, FIG. 2B schematically illustrates energy levels with a plurality of local energy minima in order to allow confinement of charges for defining appropriate logic states while still enabling movement of the charges between the energy minima in order to initiate a change of logic state, FIGS. 3A to 3D schematically illustrate basic cells and a corresponding cellular automata assembly formed on the basis of carbon nanotubes according to illustrative embodiments, FIGS. 4A to 4C schematically illustrate a basic cell formed on the basis of a graphene layer having a modified topography so as to provide appropriate local energy minima for receiving a charge in the form of an electronegative molecule or an ion, FIGS. 5A and 5B schematically illustrate a basic cell and a corresponding assembly formed on the basis of magnetic pole pairs, which in turn are constructed on the basis of graphene ribbons and FIGS. 6A and 6B schematically illustrate an electronic device and a portion thereof, respectively, wherein signals are input into and output from a QCA assembly according to illustrative embodiments.
Figure 1B:
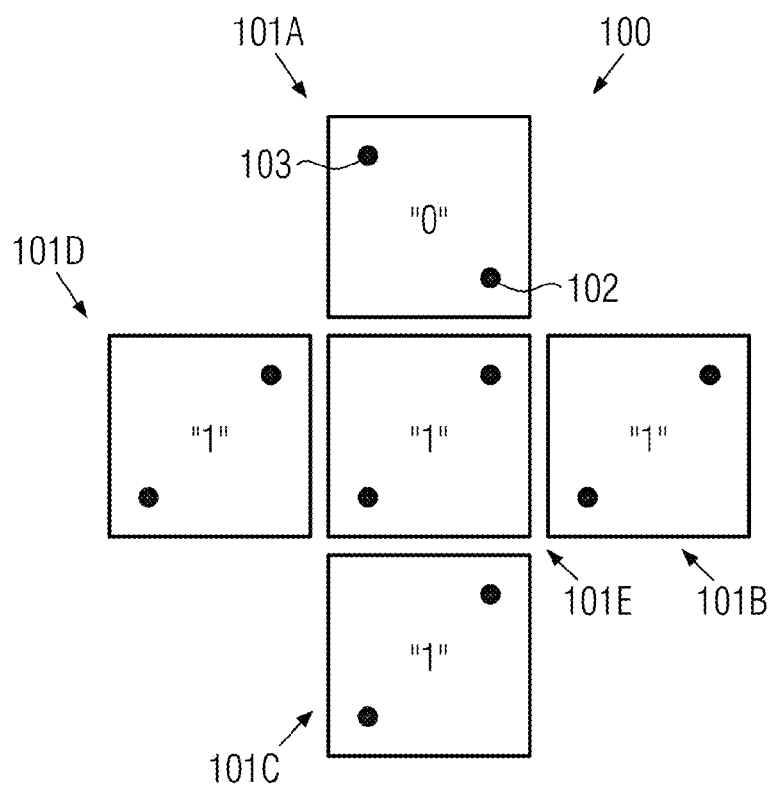
Figure 1C:
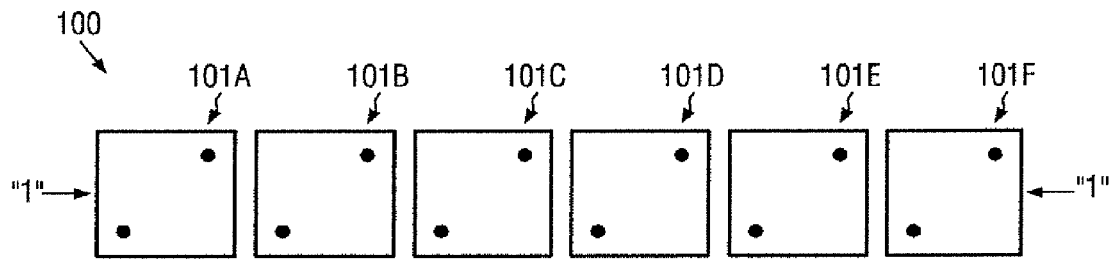
Figure 1D:
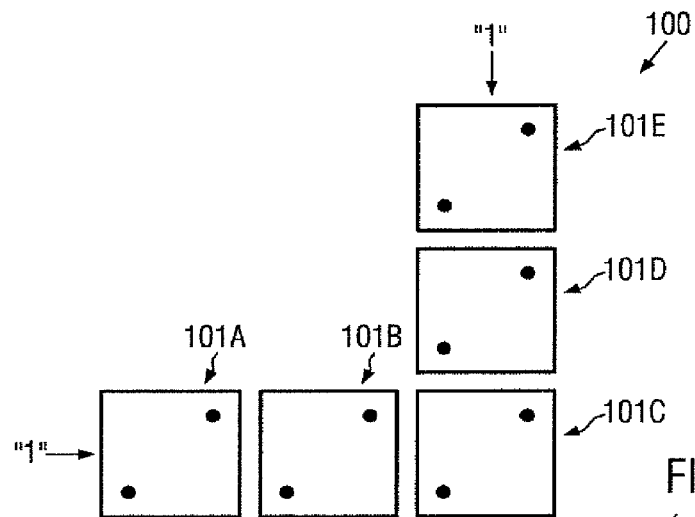
Figure 1E:
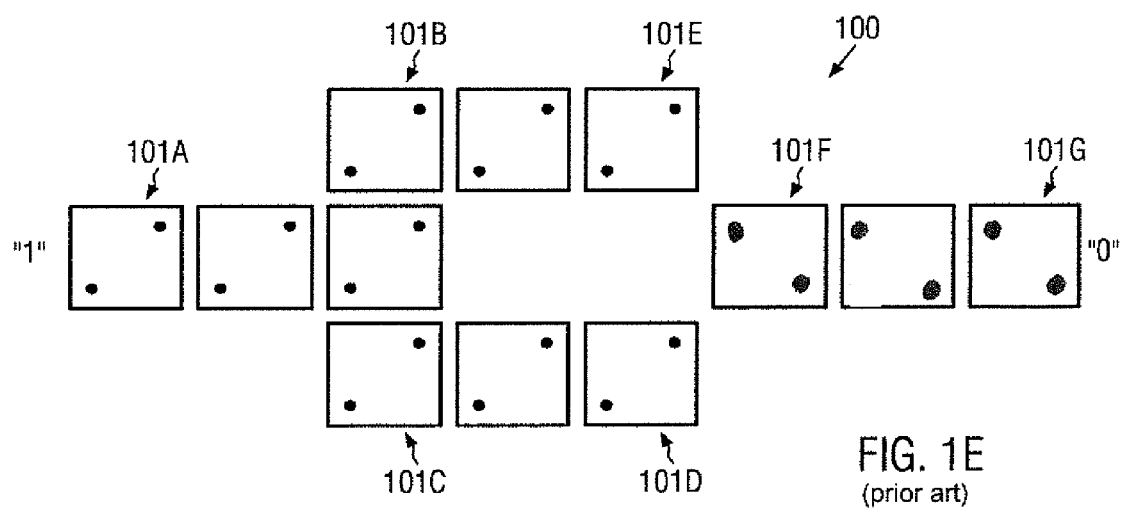
Figure 1F:
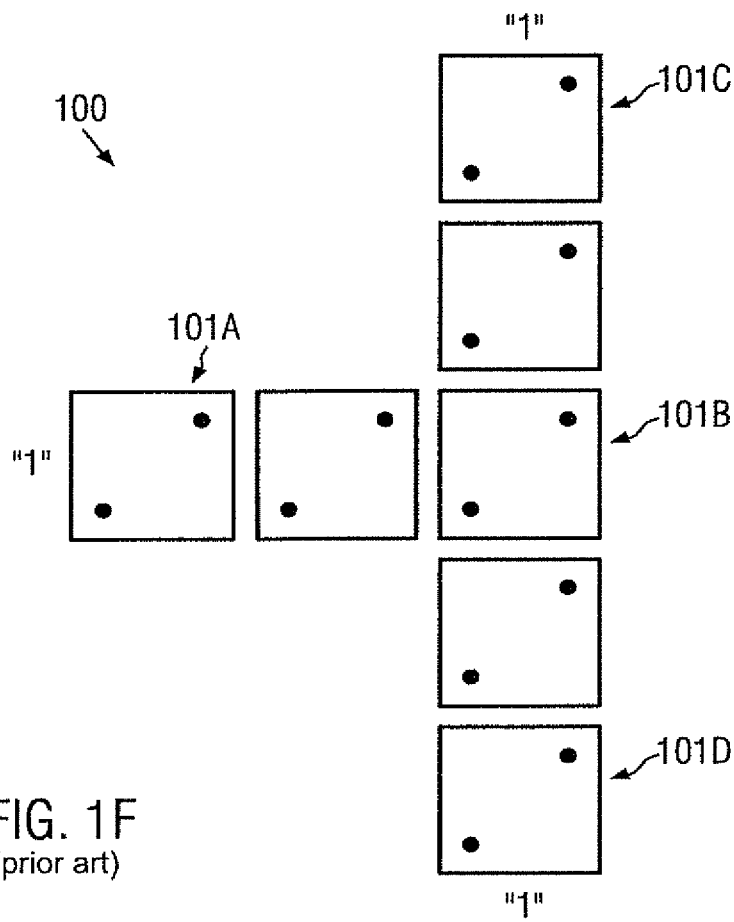
Figure 1G:
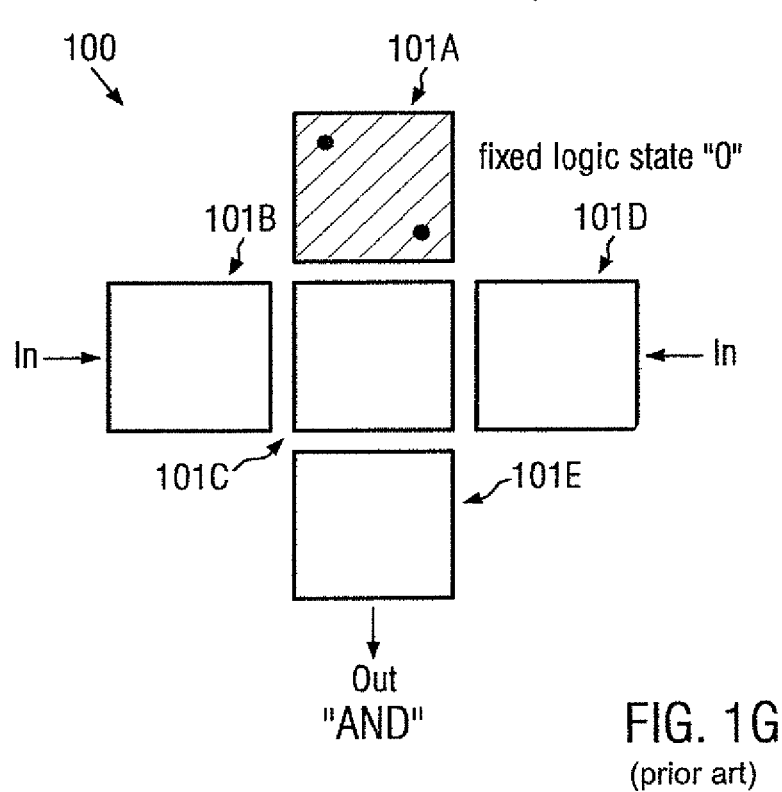
Figure 1H:
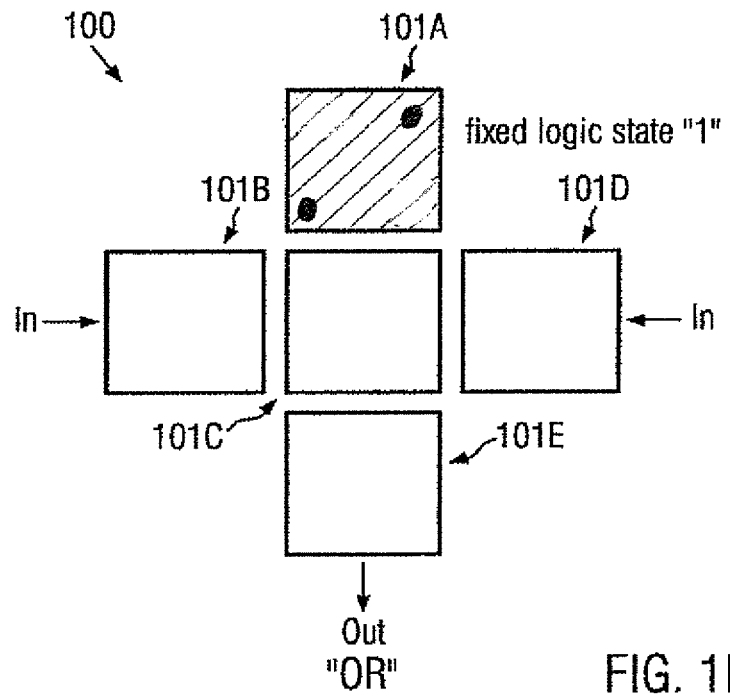

It should be appreciated that any signal propagation function or logic gates, as for instance discussed above with reference to FIG. 1, may be implemented by providing a plurality of basic cells in the assembly 300. In this case, the relative rotary positions of the various basic cells in the form of nanotubes may therefore determine the results of the corresponding signal processing. That is, by providing for nanotubes, one of which has a fixed rotary position, an AND gate or an OR gate may be constructed, as for instance discussed above with reference to FIGS. 1F and 1G. Furthermore, it is to be noted that assigning a specific rotary configuration to a logic state may be performed in any other way considered appropriate. Additionally, the provision of charge strings in the basic cells does not need to be implemented in a rotation-symmetric manner. Instead, different types of positive charges and negative charges may be incorporated, thereby providing the potential for more reliably detecting the rotary orientation of a corresponding basic cell, while in other cases more than two distinct logic states may be provided, at least in some assemblies, if considered appropriate with respect to the overall signal processing capabilities to be implemented.

Figure 4B:
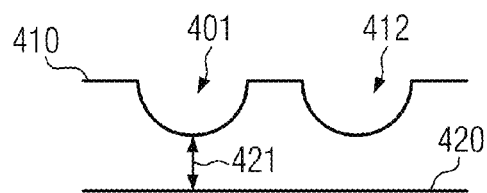
Figure 4A:
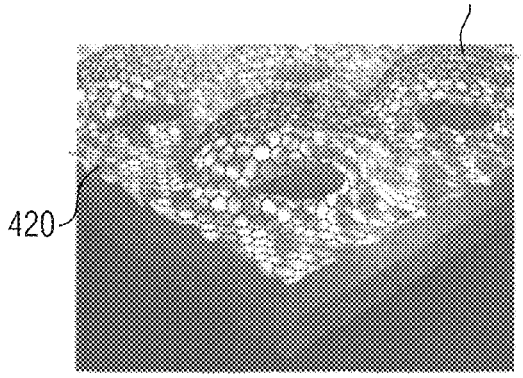

FIG. 4A schematically illustrates a perspective view of a graphene layer 410, which may comprise non-planar portions 412, which may be used for creating appropriate locations for receiving ions or molecules or any other sources for an electrostatic field. In the embodiment shown, the graphene layer 410 comprises four substantially hemispherical cavities, which may be used to receive respective charges in the form of ions, such as fluorine (F), chlorine (Cl$^-$), sulphate (SO$_4^-$), and the like or any electronegative molecules. To this end, the size of the non-planar portions 412 may appropriately be selected, for instance in the range of 15 to 20 nm. It should be appreciated that the modified portions 412 may additionally contain other mechanisms for implementing an energy minimum for corresponding charges, as already discussed above.

FIG. 4B schematically illustrates a cross-sectional view of a basic cell 401, in which according to one illustrative embodiment, an appropriate energy structure is obtained by providing the layer 410 having incorporated therein the non-planar portions 412 in combination with a graphene base layer 420 with a substantially planar configuration. That is, a "physical" band gap 421 is formed between the layers 410 and 420, thereby obtaining a desired energy minimum with respect to electronegative molecules or negatively charged ion. For example, a similar energy structure may be obtained, as is previously shown and explained with reference to FIG. 2B. In this manner, respective charges may appropriately be localized within the non-planar portions 412 while nevertheless allowing the corresponding charges to move between the energy minima 412 under the influence of the electrostatic field, i.e. the coupling field distribution, of a neighboring basic cell.

Figure 4C:
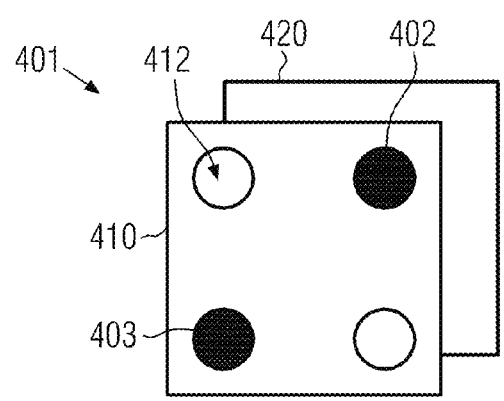

FIG. 4C schematically illustrates a perspective view from above, wherein the basic cell 401 comprises the graphene layer 410 having formed therein four modified portions 412, wherein additionally two negative charges 402, 403 are positioned within the respective portions 412, which in turn are diagonally oppositely arranged in order to obtain a minimum energy level for the charges 402, 403. Consequently, a substantially square-like cell structure may be obtained by providing the graphene layers 410 and 420 with appropriate dimensions, for instance several tens of nanometers, while also dimensioning the modified portions 412, as specified above, thereby obtaining a basic cell configuration, in which the position of the charges or at least one of the charges 402, 403 may reliably be detected so as to determine the respective logic state of the basic cell 401. On the other hand, upon being affected by a neighboring basic cell the charges 402, 403 will change position from one portion 412 to another portion 412, if required in terms of minimizing potential energy within the cell 401. Consequently, by providing a plurality of basic cells 401 any desired assembly may be constructed in order to implement the required signal processing capabilities, as for instance described above with reference to FIG. 1.

The graphene layer 410 having formed therein the non-planar portions 412 may be formed on the basis of the following process strategy. Initially, a graphene layer may be formed by chemical vapor deposition (CVD) on an appropriate carrier material, such as copper, and the like. Appropriate precursor gasses and process parameters for the deposition of carbon are well-established in the art. Next, a mask layer, such as a resist layer, may be formed on the previously deposited graphene layer. For example, poly methyl meth acrylate (PMMA) may be used as appropriate material, which may be deposited on the basis of spin coating techniques, and the like. Thereafter, an appropriate patterning process may be applied to the mask layer, for instance based on electron beam lithography or optical techniques, nano-imprint processes, which are capable of providing the required resolution in order to implement an appropriate mask above the graphene layer so as to allow the patterning thereof. After the lithography process modified resist material may be removed, for instance on the basis of well-established wet chemical techniques using, for instance, tetramethylammonium hydroxide (TMAH). Thereafter, exposed portions of the graphene layer may be treated, for instance removed by plasma etching using oxygen, and the like, thereby defining appropriate lateral dimensions of the graphene layer. Furthermore, the portions 412 may also be exposed or may be defined in a separate lithography sequence in order to enable the formation of non-planar areas as required. To this end, an intentional modification of the lattice structure may be induced, for instance by particle bombardment, and the like, thereby achieving a deviation from the planar configuration of the involved region. For example, some bondings in the hexagonal structure may be broken and rebuilt so as to obtain the desired topography. Additionally or alternatively dopant species may be incorporated in order to obtain more complex lattice irregularities, which may also contribute to a non-planar configuration.

Thereafter, any resist material may be removed, for instance by using acetone, and the resulting graphene layer having the desired topography may be transferred to the base layer 420, for instance by removing the carrier material, such as copper, and applying standard transfer techniques. It should be appreciated that the base layer 420 may also be formed on the basis of CVD techniques in order to form a graphene layer on an appropriate substrate, such as copper.

Consequently, upon forming the layers 410 and 420 the required lateral dimensions of the basic cell 401 may be adjusted, while also an appropriate energy structure is obtained by means of the structural non-planarity possibly in combination with additional intentionally induced defects, thereby achieving a desired band gap in the range of 1 eV or higher. In this manner, the electrical charges 402, 403 are sufficiently localized within the portions 412, however, allow a shift into neighboring portions 412 due to the polarization, i.e. the coupling field, of one or more neighboring basic cells.

Figure 5A:
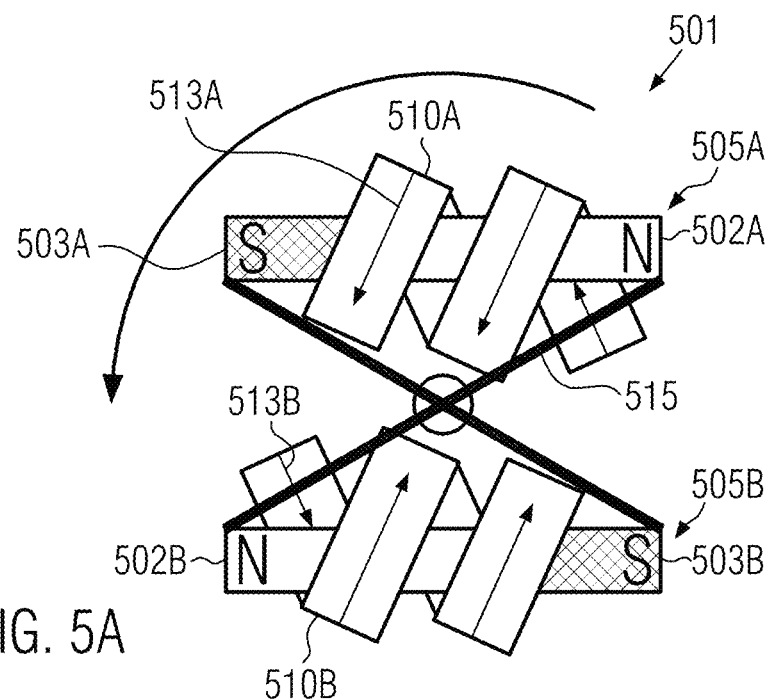

FIG. 5A schematically illustrates a basic cell 501 formed on the basis of graphene layers 510A, 510B, which are provided in the form of ribbons, i.e. elongated graphene layer portions having a length of several tens of nanometers and longer, while a width may be several nanometers or more. The graphene layers or ribbons 510A, 510B may be provided in a wound configuration, thereby resulting, upon initiating a current flow through the corresponding ribbon, a magnetic field as the coupling field distribution. Consequently, in this manner, a magnetic pole pair 502A, 503A is obtained, which in turn may adjust its spatial orientation in accordance with the magnetic field, i.e. the coupling field distribution, generated by a neighboring basic cell. In advantageous embodiments, the field strength may significantly increased by providing a ferromagnetic component or stick 505A. The ferromagnetic component 505A may also be made from a nanotube, such as a carbon nanotube, and the like.

Furthermore, in the embodiment shown, the layer 510B is also wound around a ferromagnetic component 505B, thereby obtaining the pole pair 502B, 503B with a moderately high magnetic field strength. It should be appreciated, however, that in other embodiments a single magnetic pole pair is sufficient to form the basic cell 501. In the embodiment shown, the magnetic pole pair 502A/503A is fixed relatively to the magnetic pole pair 502B/503B, thereby providing for distinct magnetic poles having a fixed relative spatial orientation to each other. An appropriate symmetric configuration with respect to a rotation of the basic cell 501 may be obtained by inducing a current flow 513A in one direction within the graphene layer 510A and inducing a current flow 513B in the opposite direction within the graphene layer 510B.

It should be appreciated that the strength of the coupling field distribution, i.e. the magnetic field strength, depends on the geometric configuration and the current density in the respective graphene layers, thereby enabling an appropriate adjustment of the energy structure for defining respective energy minima in order to allow interaction with neighboring basic cells.

Figure 5B:
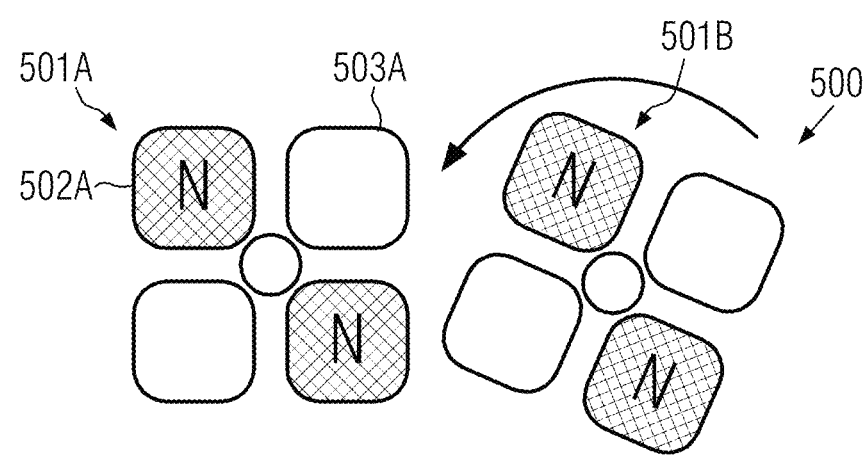

FIG. 5B schematically illustrates an assembly 500 comprising a first basic cell 501A and a second basic cell 501B, each of which has a configuration as the cell 501 described with reference to FIG. 5A, and which interact with each other on the basis of magnetic field coupling so that relative rotary orientation of the basic cells 501A, 501B is achieved in accordance with the attraction of opposite magnetic poles. Hence, in this case signal propagation and signal manipulation may be implemented by providing an appropriate number of basic cells within the assembly 500, as for instance also discussed above with reference to FIG. 3.

It should be appreciated that the corresponding current flow may be induced by directly connecting the respective graphene ribbon with a current source or voltage source, which may nevertheless allow rotary movement within a sufficient angular range due to the high flexibility of the graphene ribbon. That is, sufficiently long end portions (not shown) of the ribbons may be connected to the current source so as to still allow a high degree of freedom for rotary movement of the cell. In other cases, a current flow may be induced by induction or generally electromagnetic interaction in a non-contact configuration, if considered appropriate. Furthermore, the wound configuration of the graphene ribbons may be accomplished on the basis of well-established micromechanical manufacturing techniques.

Figure 6A:
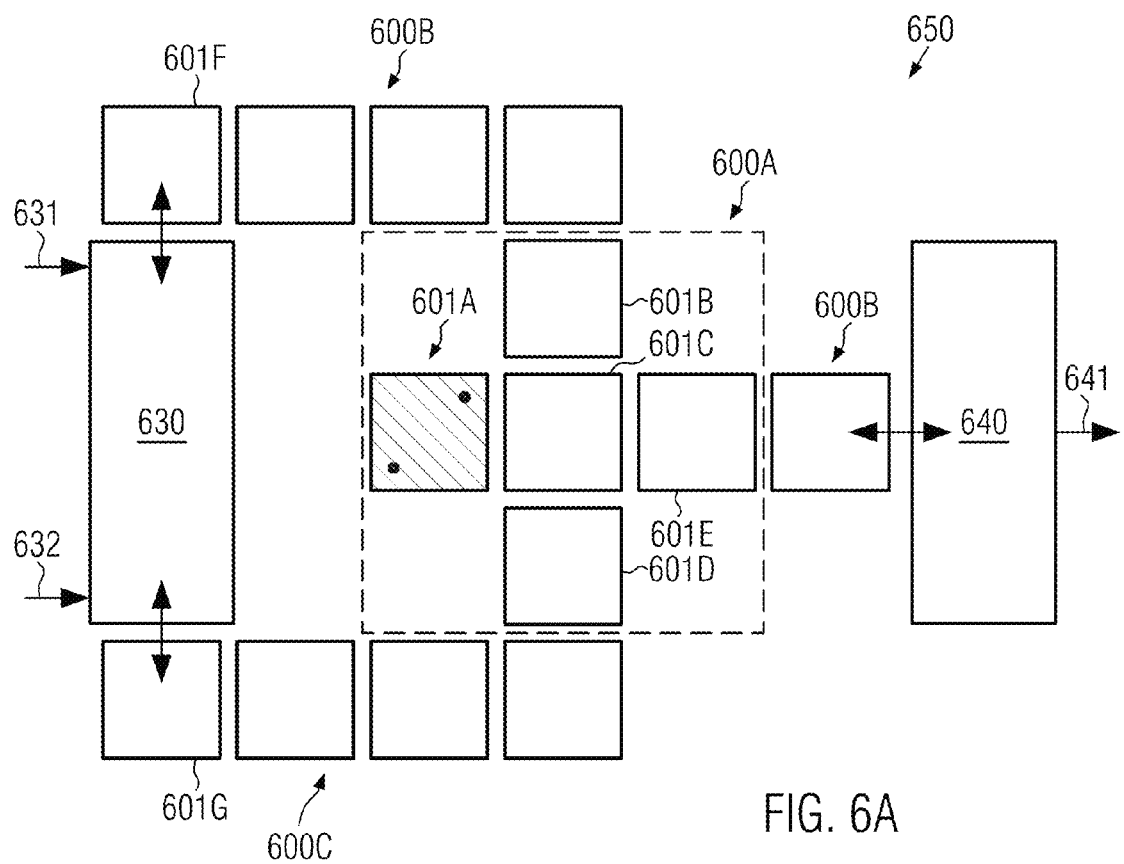

FIG. 6A schematically illustrates an electronic device 650, which comprises a plurality of QCA assemblies 600A, 600B, 600C and 600D. The QCA assemblies represents a signal processing function of the electronic device 650, wherein it is to be understood that significantly more QCA assemblies may be grouped together in order to implement a desired function. For convenience, the QCA assemblies 600A, . . . , 600D are to represent an AND function together with signal propagation capabilities in order to connect to an input stage 630 and an output stage 640. That is, the input stage 630 is appropriately configured so as to receive input signals 631, 632 which may represent any appropriate signal for carrying information, which may be expressed in logic states, for instance as binary logic states of a sequence of information bits. For example, the input signals 631, 632 may represent electrical signals, for instance in the form of a bit sequence, if a digital representation of electric signals is considered. In other cases, the input signals 631, 632 may represent analogue signals, which may be converted into digital signals within the input stage 630. Other examples of appropriate input signals are optical signals, magnetic signals, acoustic signals, and the like.

The input stage 630 is further appropriately configured so as to interact with one of the basic cells of the QCA assemblies 600B, 600C, respectively. For example, as shown the input stage 630 may interact with the basic cell 601F of the assembly 600B and with the basic cell 601G of the assembly 600C. The interaction may take place such that at least for a certain time interval the input stage 630 may generate an appropriate coupling field so as to induce a desired logic state in the respective basic cells 601F, 601G. For instance, when the assemblies 600B, 600C represent assemblies constructed on the basis of electrostatic charges, as for instance described with reference to FIG. 4, the input stage 630 may appropriately be configured so as to induce a corresponding electrostatic field that adjusts and fixes, at least for the required time interval, the charge distribution within the corresponding basic cell, thereby also adjusting a desired logic state, as discussed above. To this end, the coupling field or force may be applied for a sufficient time interval so as to allow any neighboring basic cells to adapt to the logic state of the cells 610F, 610G, respectively, however, without changing their initially induced logic states.

As discussed above with reference to FIG. 3 the interaction may take place on the basis of electrostatic forces, which may result in relative rotary motion of the basic cells, thereby also allowing a specific logic state to propagate through the assemblies 600B, 600C, respectively.

Furthermore, as explained above with reference to FIG. 5 the input stage 630 may be configured to generate an appropriate magnetic field coupling so as to adjust and fix the relatively position of the magnetic basic cells 601F, 601G, respectively, which in turn magnetically couple to their neighbors so as to cause the respective logic state to propagate through the corresponding assembly.

It should be appreciated that appropriate coupling field distributions within the input stage 630 may readily be generated by appropriate electronic or magnetic mechanisms, such as an induced current flow through an inductive component, the generation of a specific voltage distribution, and the like.

Similarly the output stage 640 is appropriately configured so as to detect the logic state of the assembly 600D, which may be represented by a single basic cell or by a plurality of cells, depending on the overall configuration. For example, the output stage 640 may be appropriately configured so as to detect a magnetic field without significantly disturbing the initial magnetic field of the assembly 600D in order to provide an output signal 641 of any appropriate form, which in turn conveys the information to any further device. In other cases, an electrostatic field distribution in the assembly 600D may be detected by the output stage 640 in order to identify the associated logic state. To this end, for instance the position of charges within the basic cell coupled to the output stage 640 may be detected, however, without significantly affecting the charge distribution in this basic cell.

During operation of the electronic device 650 the input signals 631, 632 are provided to the input stage 630 and may be converted or manipulated in any appropriate manner so as to generate a coupling field, which in turn is used for "injecting" a desired logic state into the basic cells 601F, 601G, respectively. This state is then propagated and finally input in the assembly 600A, which is illustrated as an AND gate, in which a basic cell 601A of fixed internal logic state, for instance with fixed charge distribution, and the like, is provided so as to obtain the desired logic function for the logic states input via the basic sales 601B, 601D. The central zone 601C therefore takes on the appropriate logic state due to the majority effect and conveys the logic state to the "output" cell 601E, which in turn is coupled to the assembly 600D. By interacting with the output stage 640 the assembly 600D thus transfers its logic state into the output stage 640 in order to generate the output signal 641.

Consequently, by means of the input stage 630 and the output stage 640 the electronic device 650 may take advantage of the superior signal processing capabilities of QCA assemblies while still allowing an appropriate interfacing with any other peripheral devices, such as conventional electronic devices based on semiconductor technology, and the like. It should be understood that for the sake of simplicity a very basic signal processing function, for instance an AND function is illustrated, while in other implementations significantly more complex signal processing capabilities may be provided.

Figure 6B:
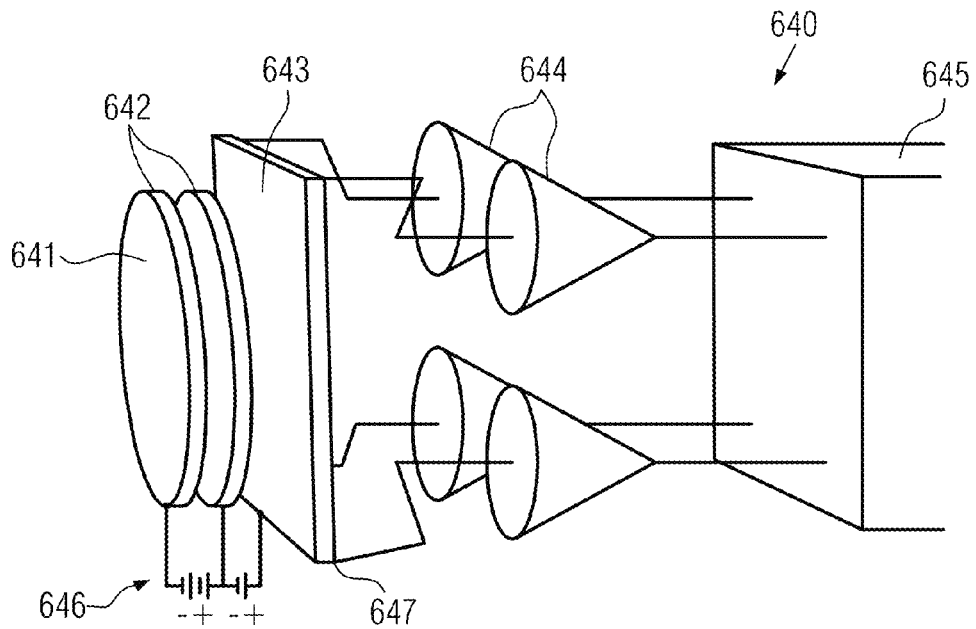

FIG. 6B schematically illustrates an implementation of the output stage 640, in which the electrostatic field and thus charge distribution may be detected without significant influence on the charge distribution of the basic cell. As shown, the output stage 640 may be implemented in the form of channel electron multipliers. As shown, a primary "radiation" is detected by charged microplates 642 in order to induce a cascade of electrons by means of a position sensitive anode 647. Moreover, the corresponding charge pulses may be detected by amplifiers 644, which may be provided in a position dependent manner so as to provide the output pulses in relation to the initial position of the charges causing the respective amplified pulse. Finally, the output signal of the amplifiers 644 may be provided to an evaluation electronic component 645 in order to provide position information with respect to the initial charge distribution. In this manner, the position of at least one extra charge on a respective basic cell may be detected in order to determine its logic state without influencing the initial charge distribution.

It should be appreciated that the spatial resolution of the output stage 640 may be improved, for instance by attaching carbon nanotubes between the anode 647 and the amplifiers 655 so as to form respective charge guides. To this end, the carbon nanotubes may be provided with an appropriate size, for instance a diameter of approximately 10 nm, so as to appropriately collect the charge carriers that are associated with the respective charge to be detected on the basic cell.

It should be appreciated that the output stage 640 may have any other appropriate configuration so as to detect the charge distribution, for instance by mechanisms as are also used in atomic force microscopy, and the like. In other cases, radiation of appropriate wavelength may be used in order to "directly" detect the charge carrying molecule or ion.

In still other cases, a magnetic field probe may be used in order to determine the magnetic field distribution without undue influence on the initial magnetic field, thereby, for instance, allowing the detection of the position of magnetic poles in order to determine the associated logic state, as for instance discussed above with reference to FIG. 5.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A cellular automata assembly for processing a signal, comprising:
   a first basic cell comprising a first graphene layer defining a first carbon nanotube used to induce a first coupling field distribution; and
   a second basic cell positioned adjacent to said first basic cell and comprising a second graphene layer defining a second carbon nanotube used to induce a second coupling field distribution, said first and second basic cells interacting with each other by said first and second coupling field distributions so as to determine a logic state of the signal.

2. The cellular automata assembly of claim 1, further comprising a first electrical charge adhering to said first graphene layer and a second electrical charge adhering to said second graphene layer.

3. The cellular automata assembly of claim 2, wherein each of said first and second electrical charges is carried by at least one of hydrogen ions and oxygen ions.

4. The cellular automata assembly of claim 3, wherein each of said first and second electrical charges is carried by a string of hydrogen ions and a string of oxygen ions.

5. The cellular automata assembly of any of claim 1, further comprising at least one further basic cell so as to interact with at least one of said first and second basic cells.

6. An electronic device for processing a signal, comprising:
   a cellular automata assembly comprising
      a first basic cell comprising a first graphene layer used to induce a first coupling field distribution, and
      a second basic cell positioned adjacent to said first basic cell and comprising a second graphene layer used to induce a second coupling field distribution, said first and second basic cells interacting with each other by said first and second coupling field distributions so as to determine a logic state of the signal;
   an input stage configured to receive the signal and to interact with at least one basic cell of said cellular automata assembly so as to adjust a logic state of said at least one basic cell in correspondence with the signal; and
   an output stage configured to interact with at least one other basic cell of said cellular automata assembly so as to provide an output signal corresponding to a logic state of said at least one other basic cell;
   said output stage comprising a charge sensitive component configured to determine a charge distribution in at least a portion of said at least one other basic cell.

7. The electronic device of claim 6, wherein said input stage is configured to provide at least one of an electric and magnetic field distribution so as to preserve said logic state of said at least one basic cell for a predetermined input time interval.

8. A cellular automata assembly for processing a signal, comprising:
   a first basic cell comprising a first graphene layer used to induce a first coupling field distribution; and
   a second basic cell positioned adjacent to said first basic cell and comprising a second graphene layer used to induce a second coupling field distribution, said first and second basic cells interacting with each other by said first and second coupling field distributions so as to determine a logic state of the signal;
   each of said first and second graphene layers comprising four non-planar layer portions, two of which contain a movable electrical charge.

9. The cellular automata assembly of claim 8, further comprising at least one further basic cell so as to interact with at least one of said first and second basic cells.

10. A cellular automata assembly for processing a signal, comprising:
    a first basic cell comprising a first graphene layer used to induce a first coupling field distribution; and
    a second basic cell positioned adjacent to said first basic cell and comprising a second graphene layer used to induce a second coupling field distribution, said first and second basic cells interacting with each other by said first and second coupling field distributions so as to determine a logic state of the signal;

each of said first and second graphene layers comprising non-planar layer portions so as to receive therein an electrical charge;

said first basic cell further comprising a first planar graphene base layer adjacent said first graphene layer, and said second basic cell further comprising a second planar graphene base layer adjacent said second graphene layer.

11. The cellular automata assembly of claim 10, wherein said first graphene layer and said first planar graphene base layer in said first basic cell and said second graphene layer and said second planar graphene base layer in said second basic cell are arranged so as to form local energy minimums for said electrical charge in said non-planar layer portions.

12. The cellular automata assembly of claim 9, further comprising at least one further basic cell so as to interact with at least one of said first and second basic cells.

13. A cellular automata assembly for processing a signal, comprising:
   a first basic cell comprising a first graphene layer used to induce a first coupling field distribution; and
   a second basic cell positioned adjacent to said first basic cell and comprising a second graphene layer used to induce a second coupling field distribution, said first and second basic cells interacting with each other by said first and second coupling field distributions so as to determine a logic state of the signal;
   each of said first and second graphene layers comprising non-planar layer portions so as to receive therein an electrical charge carried by at least one of an electronegative molecule and ion.

14. The cellular automata assembly of claim 13, further comprising at least one further basic cell so as to interact with at least one of said first and second basic cells.

15. A cellular automata assembly for processing a signal, comprising:
   a first basic cell comprising a first graphene layer defining one or more graphene ribbons used to induce a first coupling field distribution; and
   a second basic cell positioned adjacent to said first basic cell and comprising a second graphene layer defining one or more graphene ribbons used to induce a second coupling field distribution, said first and second basic cells interacting with each other by said first and second coupling field distributions so as to determine a logic state of the signal.

16. The cellular automata assembly of claim 15, further comprising at least one further basic cell so as to interact with at least one of said first and second basic cells.

17. An electronic device for processing a signal, comprising:
   a cellular automata assembly comprising
      a first basic cell comprising a first graphene layer used to induce a first coupling field distribution, and
      a second basic cell positioned adjacent to said first basic cell and comprising a second graphene layer used to induce a second coupling field distribution, said first and second basic cells interacting with each other by said first and second coupling field distributions so as to determine a logic state of the signal;
   an input stage configured to receive the signal and to interact with at least one basic cell of said cellular automata assembly so as to adjust a logic state of said at least one basic cell in correspondence with the signal; and
   an output stage configured to interact with at least one other basic cell of said cellular automata assembly so as to provide an output signal corresponding to a logic state of said at least one other basic cell;
   said output stage comprising a magnetic field sensitive probe configured to determine a magnetic field distribution in at least a portion of said at least one other basic cell.

18. The electronic device of claim 17, wherein said input stage is configured to provide at least one of an electric and magnetic field distribution so as to preserve said logic state of said at least one basic cell for a predetermined input time interval.

19. An electronic device for processing a signal, comprising:
   a cellular automata assembly comprising
      a first basic cell comprising a first graphene layer used to induce a first coupling field distribution, and
      a second basic cell positioned adjacent to said first basic cell and comprising a second graphene layer used to induce a second coupling field distribution, said first and second basic cells interacting with each other by said first and second coupling field distributions so as to determine a logic state of the signal;
   an input stage configured to receive the signal and to interact with at least one basic cell of said cellular automata assembly so as to adjust a logic state of said at least one basic cell in correspondence with the signal; and
   an output stage configured to interact with at least one other basic cell of said cellular automata assembly so as to provide an output signal corresponding to a logic state of said at least one other basic cell;
   said output stage comprising a position detecting component configured to detect at least one of a charge carrying molecule and ion.

20. The electronic device of claim 19, wherein said input stage is configured to provide at least one of an electric and magnetic field distribution so as to preserve said logic state of said at least one basic cell for a predetermined input time interval.

21. An electronic device for processing a signal, comprising:
   a cellular automata assembly comprising
      a first basic cell comprising a first graphene layer used to induce a first coupling field distribution, and
      a second basic cell positioned adjacent to said first basic cell and comprising a second graphene layer used to induce a second coupling field distribution, said first and second basic cells interacting with each other by said first and second coupling field distributions so as to determine a logic state of the signal;
   an input stage configured to receive the signal and to interact with at least one basic cell of said cellular automata assembly so as to adjust a logic state of said at least one basic cell in correspondence with the signal; and
   an output stage configured to interact with at least one other basic cell of said cellular automata assembly so as to provide an output signal corresponding to a logic state of said at least one other basic cell;
   said input stage configured to provide at least one of an electric and magnetic field distribution so as to preserve said logic state of said at least one basic cell for a predetermined input time interval.

* * * * *